United States Patent
Maruyama et al.

(10) Patent No.: US 10,347,499 B2
(45) Date of Patent: Jul. 9, 2019

(54) METHOD FOR ETCHING LAYER TO BE ETCHED

(71) Applicant: TOKYO ELECTRON LIMITED, Tokyo (JP)

(72) Inventors: Koji Maruyama, Miyagi (JP); Akira Koshiishi, Miyagi (JP); Toshio Haga, Miyagi (JP); Masato Horiguchi, Miyagi (JP); Makoto Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/567,037

(22) PCT Filed: Apr. 6, 2016

(86) PCT No.: PCT/JP2016/061283
§ 371 (c)(1),
(2) Date: Oct. 16, 2017

(87) PCT Pub. No.: WO2016/170986
PCT Pub. Date: Oct. 27, 2016

(65) Prior Publication Data
US 2018/0144948 A1 May 24, 2018

(30) Foreign Application Priority Data
Apr. 20, 2015 (JP) ................. 2015-085884

(51) Int. Cl.
*H01L 21/3065* (2006.01)
*H01L 21/311* (2006.01)
*H01J 37/32* (2006.01)

(52) U.S. Cl.
CPC .. *H01L 21/30655* (2013.01); *H01J 37/32532* (2013.01); *H01J 37/32871* (2013.01);
(Continued)

(58) Field of Classification Search
CPC ......... H01L 21/30655; H01L 21/31138; H01L 21/31116; H01L 21/3065; H01J 37/32532; H01J 37/32871
See application file for complete search history.

(56) References Cited

U.S. PATENT DOCUMENTS

2011/0139748 A1* 6/2011 Donnelly .......... H01J 37/32036
216/37

FOREIGN PATENT DOCUMENTS

JP H03-263827 A 11/1991

OTHER PUBLICATIONS

Sode et al. (Measurement and modeling of neutral, radical, and ion densities in H2—N2—Ar plasmas) Journal of Applied Physiscs V. 117, Issue 8, 083303, (2015). published online Feb. 27, 2015 (Year: 2015).*

(Continued)

*Primary Examiner* — Nadine G Norton
*Assistant Examiner* — Mahmoud Dahimene
(74) *Attorney, Agent, or Firm* — Studebaker & Brackett PC

(57) ABSTRACT

In a method of an embodiment, radicals, which are generated from a processing gas, is adsorbed to a layer to be etched without applying a high-frequency bias to a lower electrode, in an adsorption step. In the subsequent etching step, ions, which are generated from the processing gas, are drawn into the layer to be etched by applying a high-frequency bias to the lower electrode. The adsorption step and the etching step are alternately repeated. In the adsorption step, a density of radicals is 200 or greater times a density of ions. In the etching step, RF energy having a power density of 0.07 W/cm² or less is supplied to the lower electrode or a high-frequency bias having a power density of
(Continued)

0.14 W/cm² or less is supplied to the lower electrode for a period of 0.5 seconds or less.

4 Claims, 11 Drawing Sheets

(52) U.S. Cl.
CPC .... *H01L 21/3065* (2013.01); *H01L 21/31116* (2013.01); *H01L 21/31138* (2013.01)

(56) References Cited

OTHER PUBLICATIONS

International Search Report issued in PCT/JP2016/061283; dated May 17, 2016.

\* cited by examiner

METHOD FOR ETCHING LAYER TO BE ETCHED

TECHNICAL FIELD

Embodiments of the present invention relate to a method for etching a layer to be etched.

BACKGROUND ART

In manufacturing of an electronic device, plasma etching is performed with respect to a layer to be etched of a workpiece. In the plasma etching, it is required to uniformly etch the layer to be etched in a plane, that is, in-plane uniformity is required.

As a method of realizing the in-plane uniformity in the plasma etching, an atomic layer etching method in which the layer to be etched is etched in an atomic layer level, that is, an ALE method is known. In the ALE method, a step (hereinafter, referred to as "first step") of adsorbing an etchant generated from a first processing gas to the layer to be etched is performed in a processing container of a plasma processing apparatus. Subsequently, a step (hereinafter, referred to as "second step") of substituting the gas in the processing container, that is, the first processing gas with a second processing gas. Subsequently, a step (hereinafter, referred to as "third step") of generating a plasma of the second processing gas and of drawing ions into the layer to be etched is performed. Subsequently, a step (hereinafter, referred to as "fourth step" of substituting the gas in the processing container, that is, the second processing gas with the first processing gas is performed. In the ALE method, a sequence including the first to fourth steps is repetitively performed. Such an ALE method is described, for example, in Japanese Patent Application Laid-Open Publication No. H3-263827.

CITATION LIST

Patent Literature

[Patent Literature 1] Japanese Unexamined Patent Publication No. H3-263827

SUMMARY OF INVENTION

Technical Problem

As described above, in the ALE method, gas substitution is performed in the second step and the fourth step. Typically, at least of several tens of seconds are necessary for each of the second step and the fourth step. In the ALE method, the sequence including the second step and the fourth step is repetitively executed, and thus time necessary for etching of the layer to be etched becomes long. Accordingly, it is demanded to shorten time necessary for etching of the layer to be etched.

Solution to Problem

According to an aspect of the invention, there is provided a method for etching a layer to be etched of a workpiece. The method includes: (a) a step of mounting the workpiece on a mounting stage in a processing container of a plasma processing apparatus, the mounting stage including a lower electrode; (b) a step of adsorbing radicals, which are generated from a processing gas, to the layer to be etched without applying a high-frequency bias to the lower electrode (hereinafter, referred to as "adsorption step"); and (c) a step of drawing ions, which are generated from the processing gas, into the layer to be etched by applying a high-frequency bias to the lower electrode (hereinafter, referred to as "etching step"), the step of drawing ions being performed in succession to the step of adsorbing radicals. In the method, the adsorption step and the etching step are alternately repeated. In addition, in the adsorption step, a density of radicals in a space of the processing container, in which the workpiece is disposed, is set to 200 or greater times a density of ions in the space. In addition, in the etching step, the high-frequency bias having a power density of 0.07 W/cm$^2$ or less is supplied to the lower electrode or the high-frequency bias having a power density of 0.14 W/cm$^2$ or less is supplied to the lower electrode for a period of 0.5 seconds or less. Furthermore, in the etching step, the period, for which the high-frequency bias having a power density of 0.07 W/cm$^2$ or less is supplied to the lower electrode, may be set to a period of 2 seconds or less.

In the adsorption step of the method according to the aspect, the radicals are supplied to the workpiece in a state in which the high-frequency bias is not supplied to the lower electrode. In the adsorption step, the radicals are adsorbed to a surface of the layer to be etched (for example, in a physical manner). In the subsequent etching step, a plasma of the same processing gas as the processing gas that is used in the adsorption step is generated by the high-frequency bias, and thus ions are drawn into the layer to be etched due to the high-frequency bias. In the etching step, a high-frequency bias having a power density of 0.07 W/cm$^2$ or less is supplied to the lower electrode, for example, in a period of 2 seconds or less, or a high-frequency bias having a power density of 0.14 W/cm$^2$ or less is supplied to the lower electrode for a period of 0.5 seconds or less. Due to supply of the high-frequency bias, only a part of the layer to be etched to which the radicals are adsorbed is substantially etched. According to this method, it is therefore possible to etch the layer to be etched in the same manner as in ALE. In addition, in the method, the same processing gas is used in the adsorption step and the etching step, and thus it is possible to continuously execute the adsorption step and the etching step without performing gas substitution between the adsorption step and the etching step. As a result, time necessary for etching of the layer to be etched is shortened.

In an embodiment, during an execution period of the etching step, impedance of a matching unit may be fixed, wherein the matching unit is provided between a high-frequency power supply configured to generate the high-frequency bias and the lower electrode. Typically, a matching unit of a plasma processing apparatus performs an impedance matching operation, and thus time is taken until power of a high-frequency bias supplied to a load becomes stable. In contrast, in the etching step of this embodiment, the impedance of the matching unit is fixed. Accordingly, it is possible to suppress fluctuation in the power of the high-frequency bias after initiation of supply of the high-frequency bias. As a result, in this embodiment, it is possible to shorten a period of the etching step. In the etching step of one embodiment, a variable parameter of a variable electric element of the matching unit may be fixed.

In an embodiment, the plasma processing apparatus may include an ion trap on an upper side of the mounting stage. In this embodiment, a plasma of the processing gas may be generated on a side, which is opposite to a side in which the mounting stage is disposed, with respect to the ion trap, and the radicals may be supplied to the layer to be etched after passing through the ion trap.

Advantageous Effects of Invention

As described above, it is possible to shorten time necessary for etching of the layer to be etched.

DESCRIPTION OF EMBODIMENTS

Figure 1:
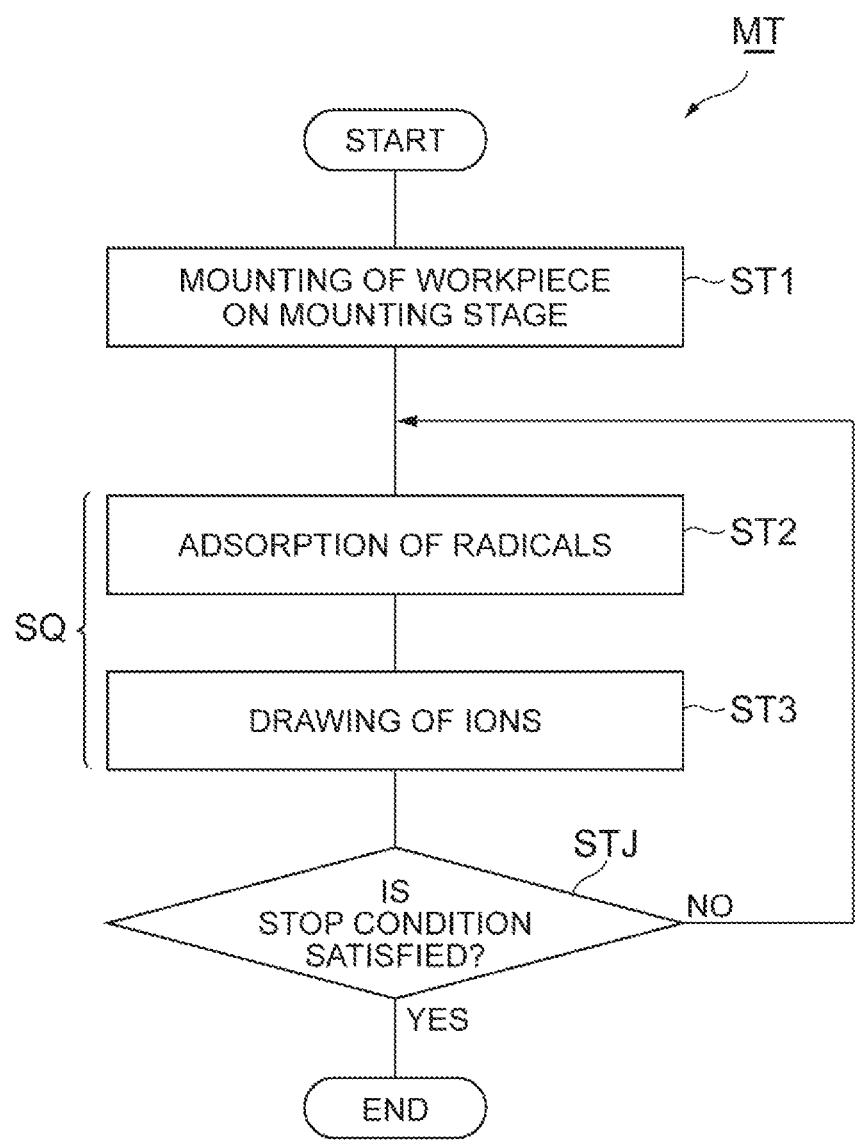
FIG. 1 is a flowchart illustrating a method for etching a layer to be etched according to an embodiment.

Hereinafter, various embodiments will be described in detail with reference to the accompanying drawings. In the drawings, the same reference symbol will be given to the same or equivalent portion.

Figure 2:
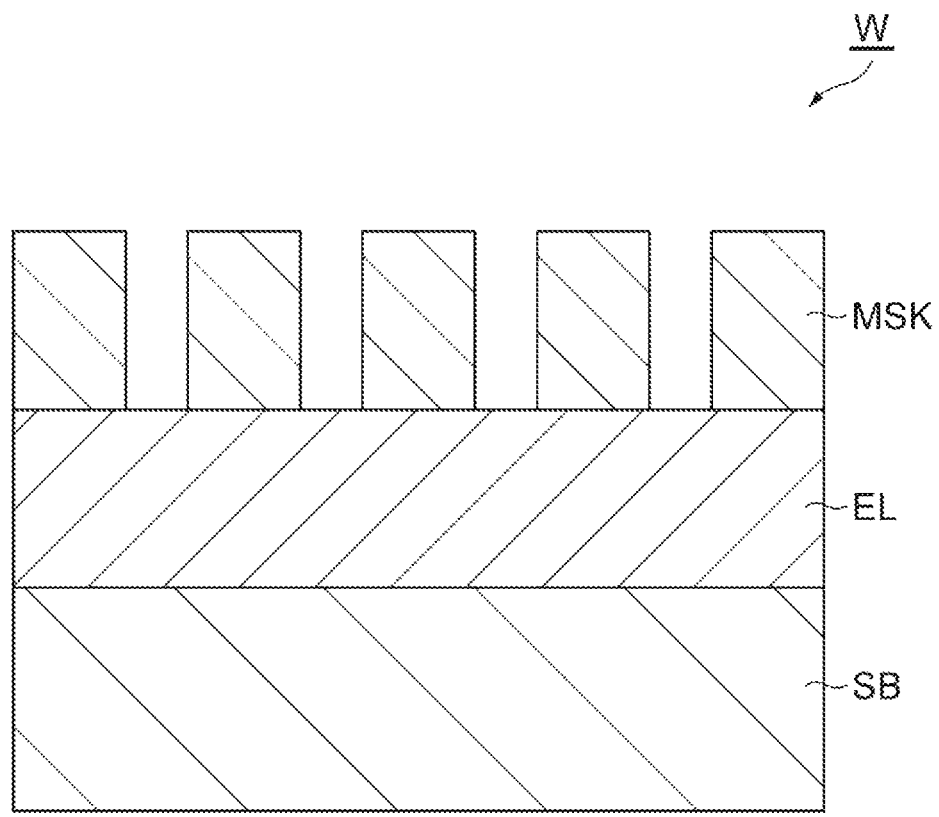
FIG. 2 is a cross-sectional view illustrating a workpiece to which the method illustrated in FIG. 1 is applicable.

FIG. 1 is a flowchart illustrating a method for etching a layer to be etched according to an embodiment. A method MT illustrated in FIG. 1 is configured to etch the layer to be etched of a workpiece. FIG. 2 is a cross-sectional view illustrating a workpiece to which the method MT is applicable. Hereinafter, the workpiece is referred to as a wafer W. The wafer W illustrated in FIG. 2 includes a substrate SB, a layer to be etched EL, and a mask MSK. The layer to be etched EL is provided on the substrate SB. The layer to be etched EL is a layer to be etched through execution of the method MT. A film kind of the layer to be etched EL is an arbitrary film kind. For example, the layer to be etched EL may be an organic film, a silicon film, a silicon oxide film, or a silicon nitride film. The mask MSK is provided on the layer to be etched EL. The mask MSK is constituted by a material that is selected to selectively etch the layer to be etched EL with respect to the mask. For example, in a case where the layer to be etched EL is the organic film, the mask MSK may be constituted by a silicon-containing material.

Figure 3:
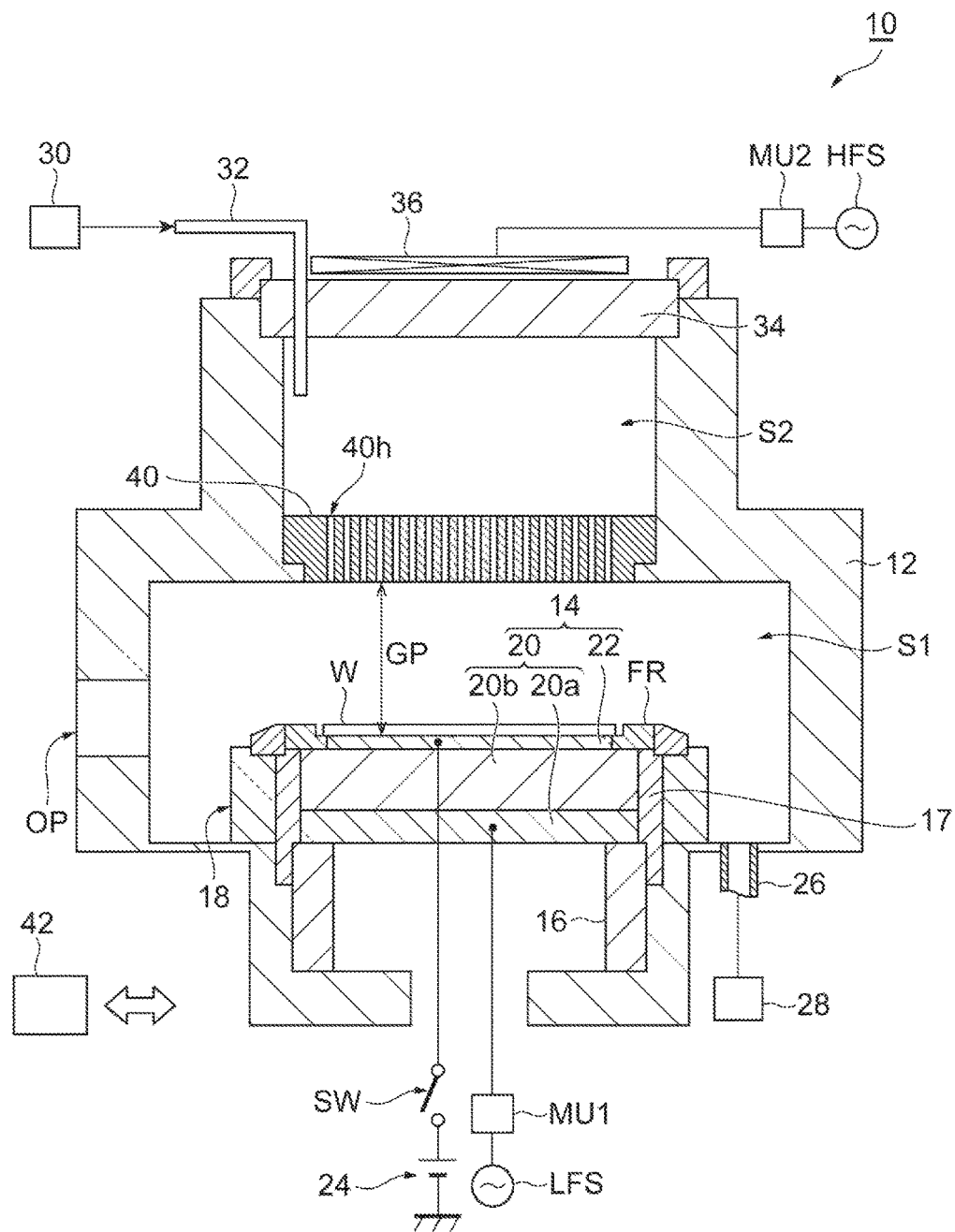
FIG. 3 is a view schematically illustrating a plasma processing apparatus capable of being used in execution of the method illustrated in FIG. 1.

Returning to FIG. 1, in the method MT, first, a step ST1 is executed. In the step ST1, the wafer W is carried into a processing container of a plasma processing apparatus, and is mounted on a mounting stage in the processing container. FIG. 3 is a view schematically illustrating the plasma processing apparatus that can be used in execution of the method MT.

A plasma processing apparatus 10 illustrated in FIG. 3 includes a processing container 12. The processing container 12 provides an internal space including a first space S1 and a second space S2, which will be described later. In an embodiment, the second space S2 is located on an upper side of the first space S1. For example, the processing container 12 is formed by a conductive material such as aluminum, and a plasma-resistant coating, for example, an yttria film is provided on an inner surface that faces the internal space of the processing container 12. The processing container 12 is electrically grounded. In addition, an opening OP for carrying of the wafer W is formed in a side wall of the processing container 12. The opening OP can be opened and closed by a gate valve.

A mounting stage 14 is provided in the first space S1 of the processing container 12. In an embodiment, the mounting stage 14 is supported by an insulating supporting member 16 that extends from the bottom of the processing container 12. In addition, an outer peripheral surface of the mounting stage 14 is covered with insulating members 17 and 18.

The mounting stage 14 includes a lower electrode 20 and an electrostatic chuck 22. The lower electrode 20 includes a first member 20a and a second member 20b. The first member 20a and the second member 20b are formed by a conductive material such as aluminum, and have an approximately disc shape. A first high-frequency power supply LFS is connected to the first member 20a through a first matching unit MU1. The first high-frequency power supply LFS is a power supply that generates a high-frequency bias LF. For example, a frequency of the high-frequency bias LF is a frequency in a range of 400 kHz to 27.12 MHz. The first matching unit MU1 includes a matching circuit configured to match output impedance of the first high-frequency power supply LFS and input impedance on a load side with each other. The matching circuit includes a variable electric element, for example, a variable capacitance element and/or a variable inductance element. In an impedance matching operation of the first matching unit MU1, variable parameters of the variable electric element, for example, variable capacitance and/or variable inductance can be automatically controller by a matching controller, in accordance with a monitoring result of load impedance.

The second member 20b is provided on the first member 20a, and is electrically connected to the first member 20a. A flow passage may be formed in the second member 20b, and a coolant may be circulated between the flow passage and a chiller unit.

The electrostatic chuck 22 is provided on the second member 20b. The electrostatic chuck 22 includes a dielectric body and an electrode that is provided at the inside of the dielectric body. A power supply 24 is connected to the electrode of the electrostatic chuck 22 through a switch SW. For example, the power supply 24 is a DC power supply. When a voltage is applied from the power supply 24 to the electrode of the electrostatic chuck 22, the electrostatic chuck 22 generates an electrostatic force, and attracts the wafer W by the electrostatic force to hold the wafer W. A heater may be embedded at the inside of the electrostatic chuck 22.

An exhaust pipe 26 is connected to the bottom of the processing container 12. The exhaust pipe 26 communicates with the first space S1, and is connected to an exhaust device 28. The exhaust device 28 includes a pressure regulator such as a pressure regulating valve, and an evacuation pump such as a turbo molecular pump and a dry pump. A pressure of the internal space of the processing container 12 is regulated by the exhaust device 28.

In addition, the plasma processing apparatus 10 has a configuration in which a processing gas from a gas supply unit 30 is supplied into the second space S2. The gas supply unit 30 may include a plurality of gas sources, a plurality of valves, and a plurality of flow rate controller such as a mass flow controller. The plurality of gas sources are sources of a plurality of kinds of gases which constitute the processing gas. Each of the plurality of gas sources are connected to a pipe 32 through a corresponding valve among the plurality of valves and a corresponding flow rate controller among the plurality of flow rate controller. The pipe 32 communicates with the second space S2.

The second space S2 is defined by the processing container 12 from a lateral side thereof. The processing container 12 provides an opening on an upper end thereof. The opening is closed with a window member 34. The window member 34 is formed by a dielectric substance such as quartz and aluminum oxide ($Al_2O_3$). In addition, a coil 36 is provided on the window member 34 and at the outside of the processing container 12. A second high-frequency power supply HFS is connected to the coil 36 through a second matching unit MU2. The second high-frequency power supply HFS generates a high-frequency wave for exciting the processing gas. A frequency of a high-frequency wave HF that is generated by the second high-frequency power supply HFS is a frequency of 13 MHz or greater, and may be 40 MHz or 60 MHz as an example. The second matching unit MU2 includes a matching circuit that matches output impedance of the second high-frequency power supply HFS and input impedance on a load side with each other. As is the case with the matching circuit of the first matching unit MU1, the matching circuit includes a variable electric element, for example, a variable capacitance element and/or a variable inductance element. Also in an impedance matching operation of the second matching unit MU2, variable parameters of the variable electric element, for example, variable capacitance and/or variable inductance can be automatically controller by a matching controller in accordance with a monitoring result of load impedance.

In the plasma processing apparatus 10, the processing gas is excited in the second space S2. As a result, in the second space S2, ions and radicals of atoms or molecules which constitute the processing gas are generated. In the plasma processing apparatus 10, an ion trap 40 is provided between the first space S1 and the second space S2 so as to trap ions which are generated in the second space S2. For example, a distance GP between a lower surface of the ion trap 40 and an upper surface of the electrostatic chuck 22 is 20 mm or greater.

The ion trap 40 is formed by a conductive material such as a metal or an insulating material such as quartz and aluminum oxide ($Al_2O_3$), and has approximately disc shape. The ion trap 40 is electrically connected to the processing container 12 so as to have the same potential as that of the processing container 12. A plurality of holes 40h are formed in the ion trap 40. The first space S1 and the second space S2 communicate with each other only through the plurality of holes 40h. In the plasma processing apparatus 10, a plasma of the processing gas is generated on a side, which is opposite to a side in which the mounting stage 14 is disposed, with respect to the ion trap 40, that is, in the second space S2. The radicals generated in the second space S2 are supplied to the first space S1 through the plurality of holes 40h, but the majority of ions generated in the second space S2 are trapped by the ion trap 40.

The plasma processing apparatus 10 further includes a control unit 42. The control unit 42 may be a computer device that includes a storage device such as a memory, an input device, a display device, and a processor such as a CPU. The control unit 42 controls respective units of the plasma processing apparatus 10 in accordance with a recipe that is stored in the storage device. For example, the control unit 42 controls respective units of the plasma processing apparatus 10 in accordance with a recipe for execution of the method MT. As a result, plasma processing according to the recipe is performed with respect to the wafer W.

Figure 4:
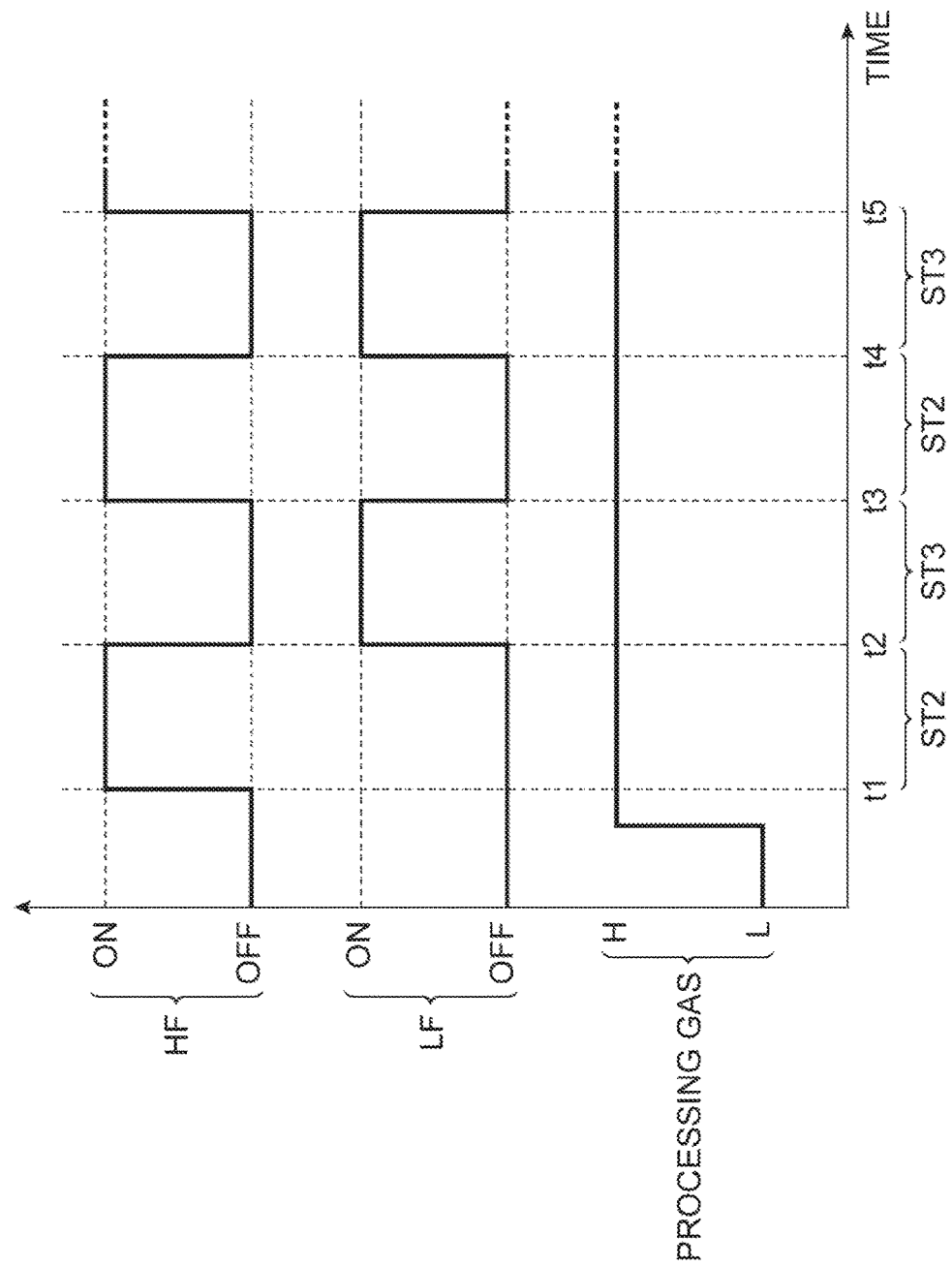
FIG. 4 is a timing chart related to a high-frequency wave, a high-frequency bias, and a processing gas in the method illustrated in FIG. 1.

The method MT will be described in detail with reference to a case of being executed by using the plasma processing apparatus 10 with reference to FIG. 1. The following description will be made with reference to FIG. 4 in addition to FIG. 1. FIG. 4 is a timing chart related to a high-frequency wave, a high-frequency bias, and a processing gas in the method MT. In FIG. 4, a state in which the high-frequency wave HF is in "ON" represents that a high-frequency wave HF is supplied to the coil 36, and a state in which the high-frequency wave HF is in "OFF" represents that the high-frequency wave HF is not supplied to the coil 36. In addition, a state in which the high-frequency bias LF is in "ON" represents that a high-frequency bias LF is supplied to the lower electrode 20, and a state in which the high-frequency bias LF is in "OFF" represents that the high-frequency bias LF is not supplied to the lower electrode 20. In addition, a state in which the processing gas is in "H" represents that the processing gas is supplied into the processing container 12, and a state in which the processing gas is in "L" represents that the processing gas is not supplied into the processing container 12.

As described above, in the step ST1 of the method MT, the wafer W is transferred into the processing container 12 of the plasma processing apparatus 10. In addition, the wafer W is held by the electrostatic chuck 22. In the method MT, a step ST2 and a step ST3 are alternately repeated, after the wafer W is mounted on the electrostatic chuck 22. That is, in the method MT, a plurality of times of sequences including the step ST2 and the step ST3 are executed.

In the step ST2, radicals, which are generated from the processing gas, are adsorbed to the layer to be etched EL. To this end, in the step ST2, the processing gas is supplied into the second space S2. As illustrated in FIG. 4, supply of the processing gas is initiated before time t1 at which the step ST2 is initiated for the first time. In the method MT, supply of the processing gas continues until the method MT is terminated.

In a case where the layer to be etched EL is an organic film, the processing gas may include, for example, a hydrogen gas ($H_2$ gas), a nitrogen gas ($N_2$ gas), and a rare gas. The rare gas may be an Ar gas. Furthermore, as the rare gas, an arbitrary rare gas such as a He gas, a Ne gas, and a Kr gas may be used. The processing gas may include an ammonia ($NH_3$) gas and or an oxygen ($O_2$) gas instead of the hydrogen gas and the nitrogen gas, or in addition to the hydrogen gas and the nitrogen gas. In addition, in a case where the layer to be etched EL is a silicon film, the processing gas may include a halogen-containing gas such as a hydrogen bromide gas or a chlorine gas, and a rare gas. In addition, in a case where the layer to be etched EL is a silicon oxide film, the processing gas may include a fluorocarbon gas and a rare gas. In addition, in a case where the layer to be etched EL is a silicon nitride film, the processing gas may include a fluorohydrocarbon gas ($C_XH_YF_Z$: X, Y, and Z are integers of one or greater) and/or a fluorocarbon gas ($C_XF_Y$: X and Y are integers of one or greater), and a rare gas.

In addition, in an execution period (from time t1 to time t2, and from time t3 to time t4 in FIG. 4) of the step ST2, the high-frequency wave HF is supplied from the second high-frequency power supply HFS to the coil 36. As a result, the processing gas is excited in the second space S2, and thus ions and radicals are generated. It should be noted that the high-frequency bias LF from the first high-frequency power supply LFS is not supplied to the lower electrode 20, in the step ST2.

The majority of the ions, which are generated in the second space S2 by execution of the step ST2, are trapped by the ion trap 40. On the other hand, the radicals pass through the plurality of holes 40h of the ion trap 40 and enter the first space S1. In the step ST2, the radicals supplied into the first space S1 are adsorbed to the layer to be etched EL. Furthermore, a density of the radicals in a space in which the wafer W is disposed, that is, the first space S1 in this example is set to 200 or greater times a density of the ions in the first space S1.

In the subsequent step ST3, the ions, which are generated from the processing gas, are drawn into the layer to be etched EL. To this end, the processing gas supplied in the step ST2 is continuously supplied into the second space S2 in the step ST3.

In addition, as illustrated in FIG. 4, in an execution period (from time t2 to time t3, and from time t4 to time t5) of the step ST3, the high-frequency wave HF from the second high-frequency power supply HFS is not supplied to the coil 36, and the high-frequency bias LF from the first high-frequency power supply LFS is supplied to the lower electrode 20.

The processing gas that is supplied into the second space S2 includes a rare gas, and the rare gas passes through the plurality of holes 40h of the ion trap 40 and is supplied into the first space S1. The rare gas, which is supplied into the first space S1, is excited by the high-frequency bias LF. Accordingly, ions of rare gas atoms are generated, and the ions of the rare gas atoms are drawn into the wafer W by the high-frequency bias LF. As a result, atoms, to which radicals adhere, are released from the layer to be etched EL.

In each sequence SQ of the method MT, the layer to be etched EL is etched by 0.2 nm or less, that is, at a depth of an atomic layer level. Accordingly, in the step ST3, it is necessary to control supply of the high-frequency bias LF so that only atoms to which radicals adhere are released from the layer to be etched EL. To this end, in the step ST3 of an embodiment, the high-frequency bias LF having a power density of 0.07 W/cm$^2$ or less is supplied to the lower electrode 20. The high-frequency bias LF having the power density of 0.07 W/cm$^2$ or less is supplied to the lower electrode 20, for example, for a period of 2 seconds or less. In another embodiment, the high-frequency bias LF having a power density of 0.14 W/cm$^2$ or less is supplied to the lower electrode 20 for a period 0.5 seconds or less.

Figure 5:
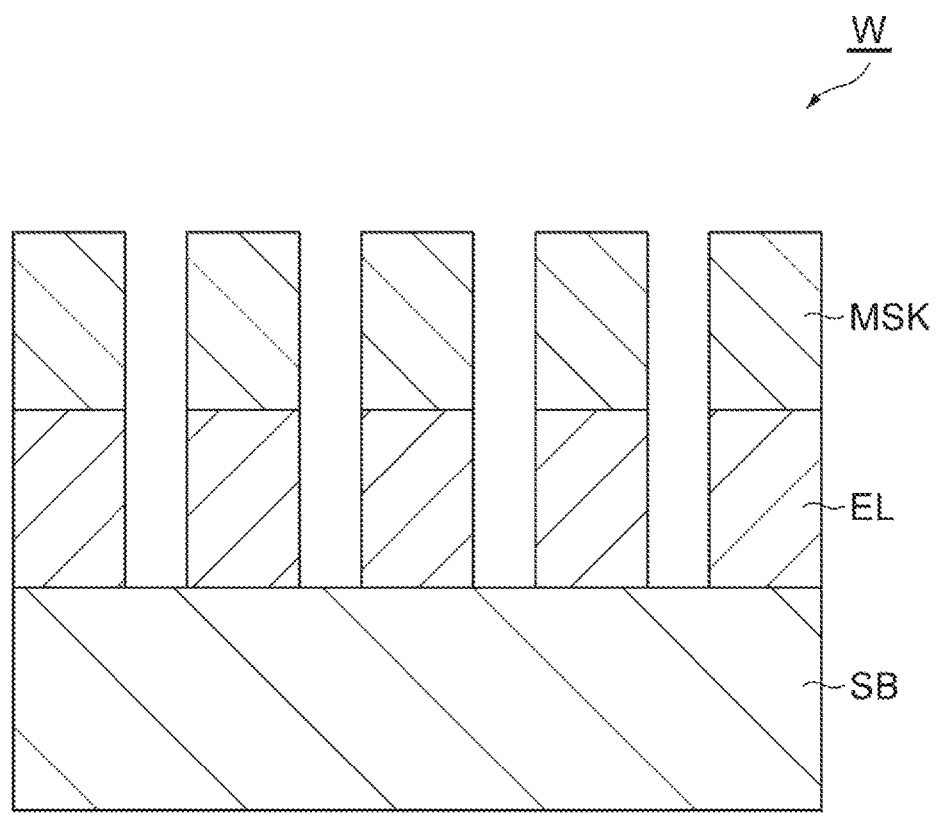
FIG. 5 is a cross-sectional view illustrating a state of the workpiece after execution of the method illustrated in FIG. 1.

In the method MT, determination is made on whether or not a stop condition is satisfied in a step STJ after execution of the step ST3. For example, it is determined that the stop condition is satisfied when the number of execution times of the sequence SQ including the step ST2 and the step ST3 reaches a predetermined number of times. In the step STJ, in a case where it is determined that the stop condition is not satisfied, execution of the sequence SQ including the step ST2 and the step ST3 is performed again. On the other hand, in the step STJ, in a case where it is determined that the stop condition is satisfied, execution of the method MT is terminated. As described above, in the method MT, a plurality of times of sequences SQ are executed, and finally, as illustrated in FIG. 5, a region, which is exposed from the mask MSK in the whole region of the layer to be etched EL, is etched until a surface of the substrate SB is exposed.

Hereinafter, description will be given of the principle of the method MT with reference to FIG. 6A, FIG. 6B, FIG. 6C, FIG. 7A, FIG. 7B, and FIG. 7C. FIG. 6A, FIG. 6B, FIG. 6C, FIG. 7A, FIG. 7B, and FIG. 7C are views illustrating the principle of etching in the method illustrated in FIG. 1. Furthermore, in FIG. 6A, FIG. 6B, FIG. 6C, FIG. 7A, FIG. 7B, and FIG. 7C, a white circle represents an atom that constitutes the layer to be etched EL, a black circle represents a radical, and "+" surrounded by a circle represents an ion of a rare gas atom.

Figure 6C:
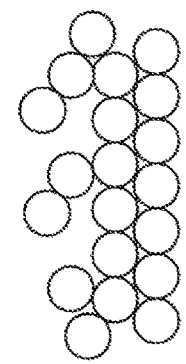
FIG. 6A, FIG. 6B, and FIG. 6C are views illustrating the principle of the etching in the method illustrated in FIG. 1.
Figure 6B:
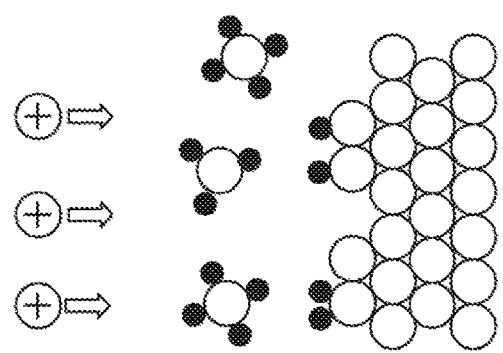
Figure 6A:
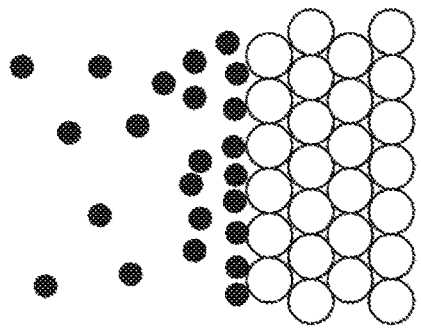

As illustrated in FIG. 6A, when the step ST2 is executed for the first time, a surface state of the layer to be etched EL is in a state in which a dangling bond does not exist or the number of dangling bonds is small. In the step ST2 executed for the first time, radicals are adsorbed to a surface of the layer to be etched EL in this state. In the subsequent step ST3 executed for the first time, as illustrated in FIG. 6B, ions of rare gas atoms collide with the surface of the layer to be etched EL, and thus atoms, to which the radicals are adsorbed, of the layer to be etched EL are released from the layer to be etched EL and exhausted. As a result, as illustrated in FIG. 6C, the dangling bonds are formed on the surface of the layer to be etched EL.

Figure 7A:
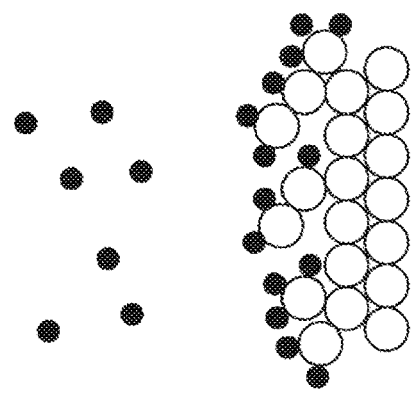
FIG. 7A, FIG. 7B, and FIG. 7C are views illustrating the principle of the etching in the method illustrating in FIG. 1.

Also in the step ST2 from the second time, the radicals are supplied to the layer to be etched EL. From a Langmuir Absorption Model, for example, the radicals have energy of 5 eV or less, and are effectively coupled to the dangling bonds. Therefore, in the step ST2 from the second time, radicals for one layer are adsorbed to the surface of the layer to be etched EL with a high coverage factor as illustrated in FIG. 7A.

Figure 7B:
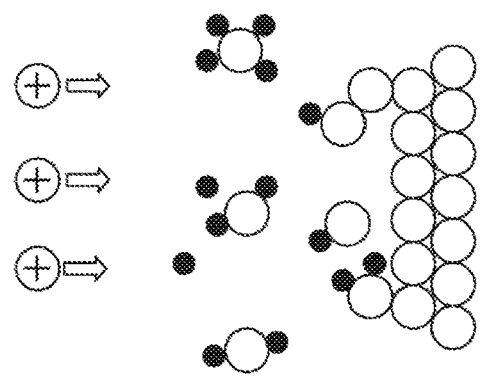
Figure 7C:
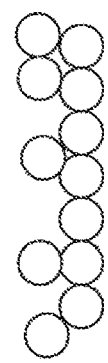

Also in the step ST3 from the second time, rare gas ions are drawn into the layer to be etched EL that is in a state in which radicals are adsorbed thereto. Accordingly, as illustrated in FIG. 7B, atoms, to which the radicals are adsorbed, are released from the layer to be etched EL and exhausted. As a result, dangling bonds are formed on the surface of the layer to be etched EL, as illustrated in of FIG. 7C. Through repetition of the sequence including the step ST2 and the step ST3, the layer to be etched EL is etched as illustrated in FIG. 5, in the method MT.

In the method MT, as described above, the same processing gas is used in the step ST2 and the step ST3, and the step ST2 and the step ST3 are continuously executed. Accordingly, a period for substitution of the processing gas is not necessary between the step ST2 and the step ST3. Therefore, according to the method MT, it is possible to shorten time necessary for the etching of the layer to be etched EL.

In an embodiment, impedance of the first matching unit MU1 may be fixed during execution period of the step ST3. That is, the variable parameters of the variable electric element that constitutes the matching circuit of the first matching unit MU1 may be constantly maintained. Typically, the matching unit of the plasma processing apparatus performs an impedance matching operation, and thus time is taken until power of a high-frequency bias supplied to a load becomes stable. On the other hand, when the impedance of the first matching unit MU1 is fixed in the step ST3, it is possible to suppress fluctuation in the power after initiation of supply of the high-frequency bias LF. As a result, it is possible to shorten an execution period of the step ST3.

Hereinafter, description will be given of a simulation that is performed for evaluation of the method MT. In the simulation, a ratio between a radical flux and an ion flux in the first space S1 is set to various ratios, and time t, at which the coverage factor θ(t) with radicals in the layer to be etched EL becomes 1, is calculated from the Langmuir Absorption Model. Here, the coverage factor θ(t) becomes 1 when the entire sites of the layer to be etched EL are filled with the radicals. In addition, the coverage factor θ(t) is calculated from the following Expression (1)

$$\theta(t) = \frac{\left(\frac{S \cdot \Gamma r}{Y \cdot \Gamma i}\right)}{\left(\frac{S \cdot \Gamma r}{Y \cdot \Gamma i}\right) + 1} - e^{-(Y \cdot \Gamma i + S \cdot \Gamma r) t}. \quad (1)$$

In Expression (1), S represents an adhesion rate of the radicals, Y represents an etching yield by ions, Fr represents a radical flux ($cm^{-2} s^{-1}$), Fi represents an ion flux ($cm^{-2} s^{-1}$), and these parameters are determined by the kind of radicals, the kind of ions, and a material of the layer to be etched EL. In the simulation, a silicon film is assumed as the layer to be etched EL, chlorine radicals are assumed as radicals, and Ar ions are assumed as ions.

Figure 8:
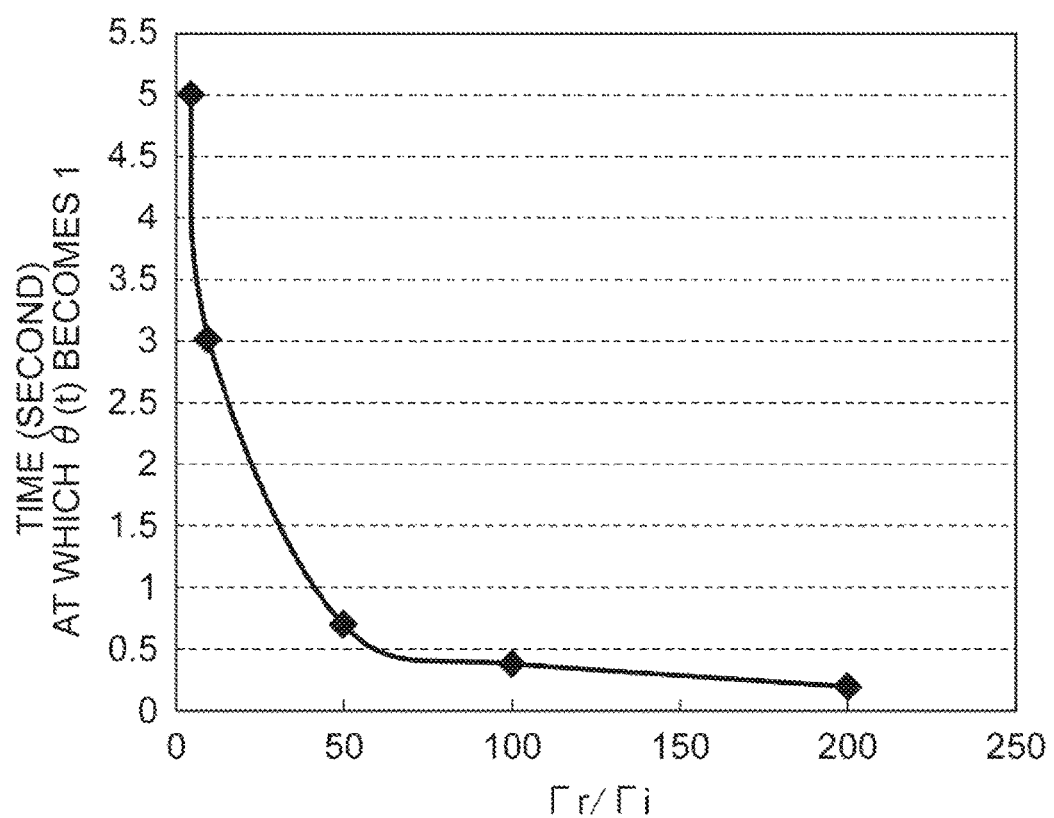
FIG. 8 is a graph illustrating a simulation result.

FIG. 8 represents a graph illustrating simulation results. As illustrated in FIG. 8, when Fr/Fi is 1, time taken until θ(t) becomes 1 is five seconds. As Fr/Fi increases, time taken until θ(t) becomes 1 decreases. In addition, when Fr/Fi is 200, time taken until θ(t) becomes 1 does not substantially vary, and θ(t) becomes 1 at 0.3 seconds. Even when the kind of radicals, the kind of ions, and the film kind of the layer to be etched EL are different in each case, the above-described tendency becomes approximately the same. Accordingly, it is confirmed that it is possible to realize adsorption of radicals to the surface of the layer to be etched EL with a high coverage factor and in a short time when Fr/Fi is 200, that is, the density of radicals is 200 or greater times the density of ions, in the step ST2.

Hereinafter, description will be given of an experiment that is performed by using the plasma processing apparatus 10 for evaluation of the method MT.

Experiment Example 1

In Experiment Example 1, the following conditions were set in the method MT, and the power of the high-frequency bias LF in the step ST3 and an execution time length of the step ST3 in each sequence SQ were variously set. In this state, etching of an organic film was performed.
<Conditions>
Processing gas: 150 sccm of $N_2$ gas, 150 sccm of $H_2$ gas, and 1000 sccm of Ar gas
Pressure in the internal space of the processing container 12: 50 mTorr (6.666 Pa)
Power of high-frequency wave HF in the step ST2: 500 W
Power of the high-frequency bias LF in the step ST2: 0 W
Power of high-frequency wave HF in the step ST3: 0 W
In addition, in a comparative experiment example, etching of an organic film was performed through repetition of a sequence including a first step to a fourth step under the following conditions. In the comparative experiment example, an execution time length of the third step in each sequence was fixed to 2 seconds, and the power of the high-frequency bias LF in the third step was variously set.

Figure 9:
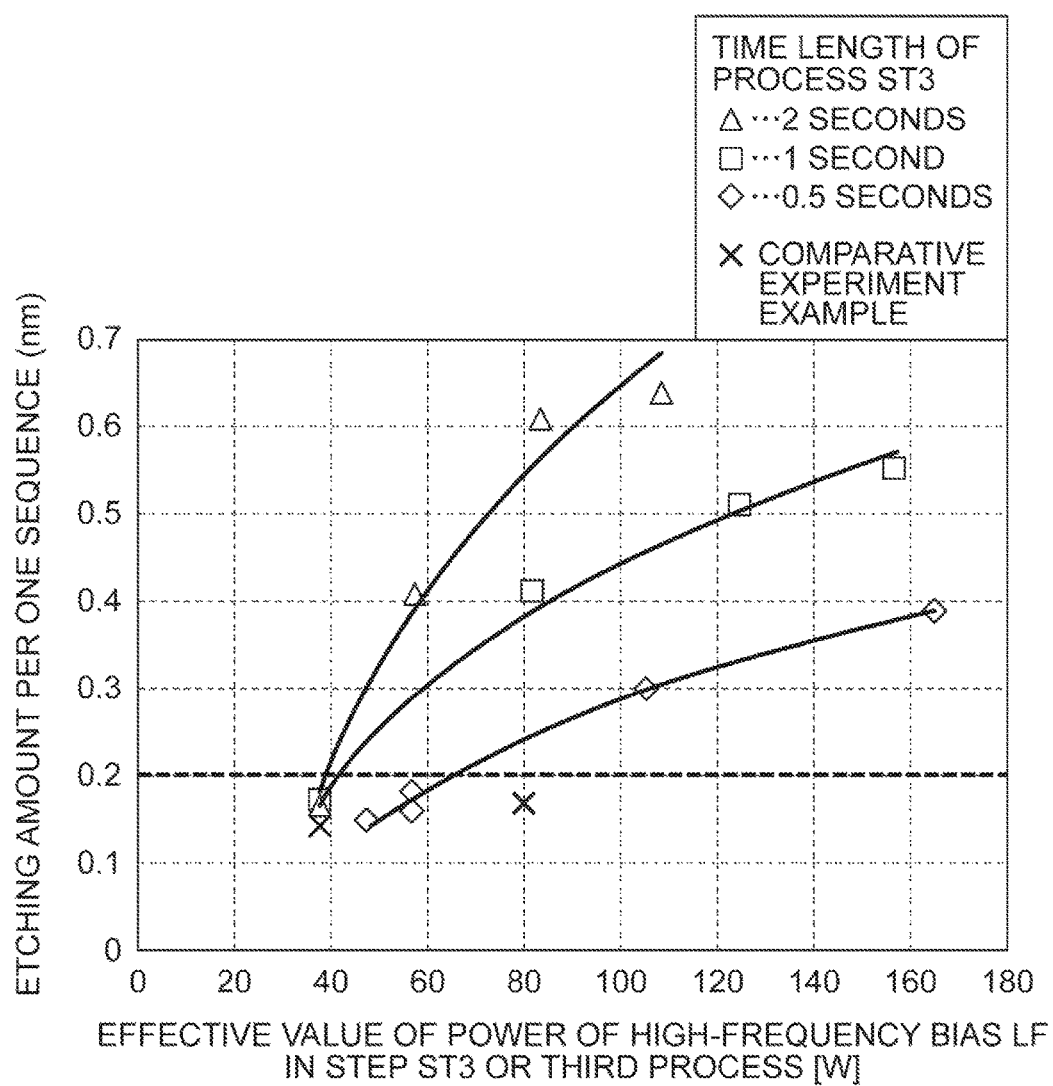
FIG. 9 is a graph illustrating an experiment result.

<Conditions>
Pressure in the internal space of the processing container 12: 50 mTorr (6.666 Pa)
Processing gas in the first step: 150 sccm of $N_2$ gas, 150 sccm of $H_2$ gas, and 1000 sccm of Ar gas
Power of high-frequency wave HF in the first step: 500 W
Power of the high-frequency bias LF in the first step: 0 W
Processing gas in the second step: 1000 sccm of Ar gas
Power of high-frequency wave HF in the second step: 0 W
Power of the high-frequency bias LF in the second step: 0 W
Processing gas in the third step: 1000 sccm of Ar gas
Power of high-frequency wave HF in the third step: 0 W
Processing gas in the fourth step: 150 sccm of $N_2$ gas, 150 sccm of $H_2$ gas, and 1000 sccm of Ar gas
Power of the high-frequency wave HF in the fourth step: 0 W
Power of the high-frequency bias LF in the fourth step: 0 W In addition, an etching amount (depth) of the organic film per one sequence was obtained from a reduction in the film thickness of the organic film after etching in Experiment Example 1 and the comparative experiment example. Results are illustrated in FIG. 9. In FIG. 9, the horizontal axis represents an effective value of the power of the high-frequency bias LF in the step ST3 (or the third step in the comparative experiment example), and the vertical axis represents an etching amount (depth) of the organic film per one sequence. In addition, in FIG. 9, a dotted line represents 0.2 nm that is an etching amount per one sequence which is shown in the ALE method.

The comparative experiment example employed the typical ALE method, and as illustrated in FIG. 9, in the comparative experiment example, the etching amount of the organic film per one sequence was 0.2 nm or less regardless of the power of the high-frequency bias in the third step. In addition, in Experiment Example 1, it was confirmed that in a case where the effective value of the power of the high-frequency bias LF in the step ST3 was 40 W or less, that is, in a case where the power of the high-frequency bias LF in the step ST3 was 50 W or less, an etching amount of 0.2 nm or less was obtained regardless of the execution time length of the step ST3. Accordingly, it was confirmed that when the power of the high-frequency bias LF in the step ST3 is 50 W or less in the method MT, it is possible to etch the layer to be etched in the same manner as in the ALE method. It should be noted that the power density of the high-frequency bias LF of 50 W or less is a power density of 0.07 W/$cm^2$ or less.

Experiment Example 2

Figure 10:
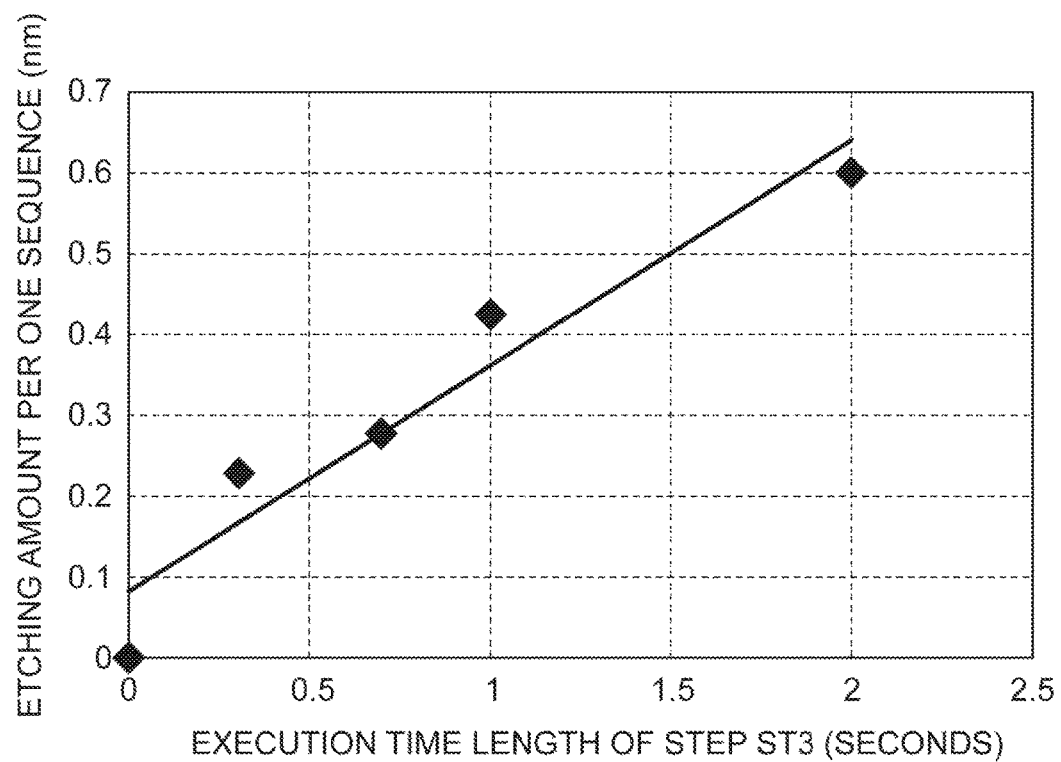
FIG. 10 is a graph illustrating an experiment result.

In Experiment Example 2, in the method MT, the following conditions were set, and the execution time length of the step ST3 in each sequence SQ was variously set. In this state, etching of the organic film was performed.
<Conditions>
Processing gas: 150 sccm of $N_2$ gas, 150 sccm of $H_2$ gas, and 1000 sccm of Ar gas
Pressure in the internal space of the processing container 12: 50 mTorr (6.666 Pa)
Power of high-frequency wave HF in the step ST2: 500 W
Power of the high-frequency bias LF in the step ST2: 0 W
Power of high-frequency wave HF in the step ST3: 0 W
Power of the high-frequency bias LF in the step ST3: 100 W In addition, an etching amount (depth) of the organic film per one sequence was obtained from a reduction in the film thickness of the organic film after etching in Experiment Example 2. Results are illustrated in FIG. 10. In FIG. 10, the horizontal axis represents an execution time length of the step ST3 in each sequence SQ, and the vertical axis represents an etching amount (depth) of the organic film per one sequence. As illustrated in FIG. 10, it was confirmed that in a case where the power of the high-frequency bias LF in the step ST3 was 100 W, the etching amount per one sequence became approximately 0.2 nm or less, when the execution time length of the step ST3 in each sequence SQ is 0.5 seconds or less. Accordingly, it was confirmed that when the power of the high-frequency bias LF in the step ST3 is 100 W or less, and the execution time length of the step ST3 in each sequence SQ is 0.5 seconds or less, in the method MT, the layer to be etched can be etched in approximately the same manner as in the ALE method.

Figure 11:
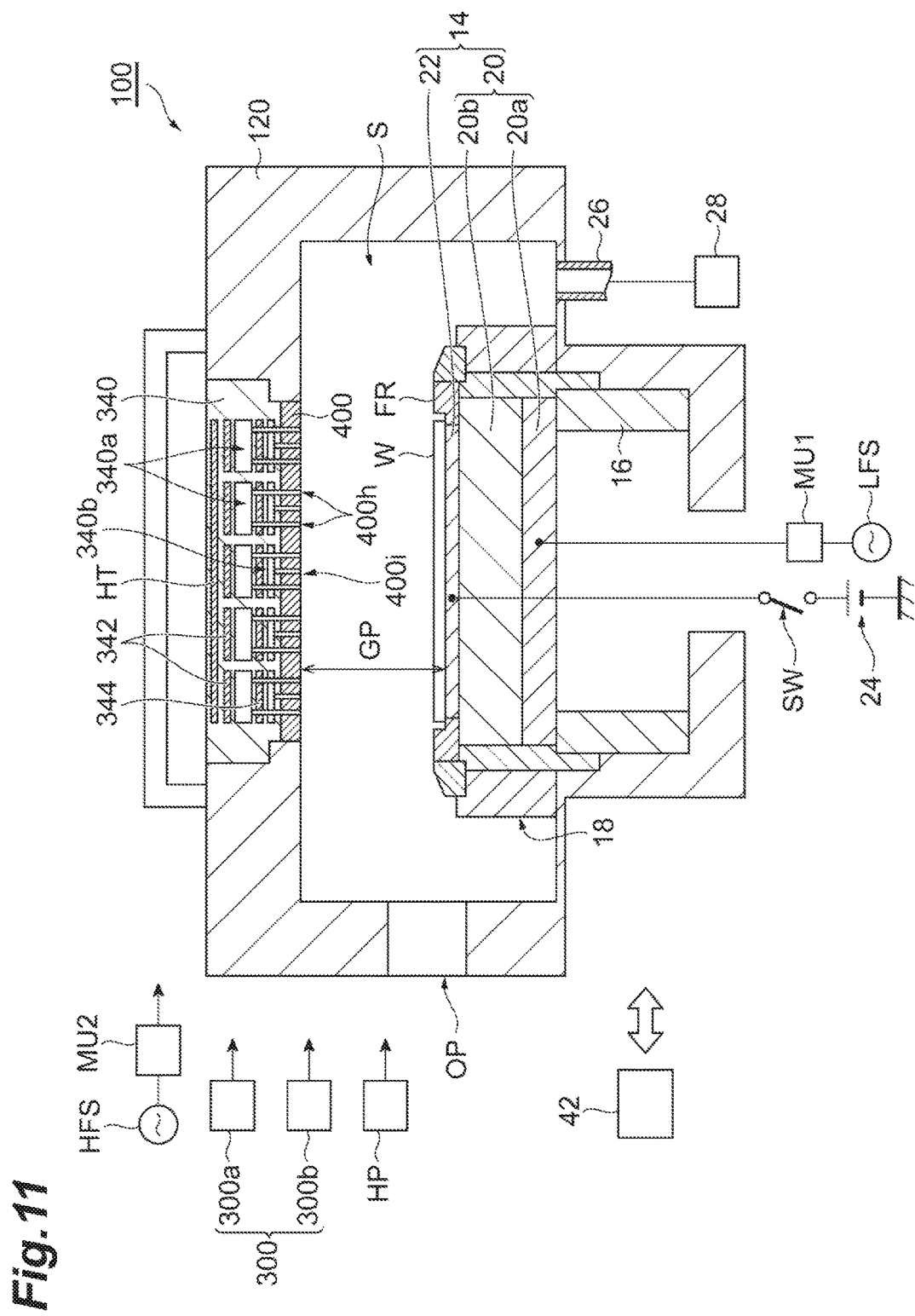
FIG. 11 is a view schematically illustrating another plasma processing apparatus capable of being used in execution of the method illustrated in FIG. 1.

Hereinafter, description will be given of another plasma processing apparatus that can be used in execution of the method MT. FIG. 11 is a view schematically illustrating the other plasma processing apparatus that can be used in execution of the method illustrated in FIG. 1. A plasma processing apparatus 100 illustrated in FIG. 11 includes a processing container 120. The processing container 120 provides a space S as an internal space thereof. For example, the processing container 120 is formed by a conductive material such as aluminum, and a plasma-resistant coating, for example, an yttria film is provided on an inner surface that faces the internal space of the processing container 12. The processing container 120 is electrically grounded.

A mounting stage 14 is provided in the space S of the processing container 120. The mounting stage 14 is the same as the mounting stage 14 of the plasma processing apparatus 10. A first high-frequency power supply LFS is connected to a lower electrode 20 of the mounting stage 14 through a first matching unit MU1.

An upper end of the processing container 120 is opened, and the opening is closed by a ceiling member 340. The ceiling member 340 is formed by a dielectric substance such as quartz. A plurality of gas chambers 340a are formed in the ceiling member 340. For example, the plurality of gas chambers 340a are provided concentrically around an axis that passes through the center of an electrostatic chuck 22. A processing gas is supplied to the gas chambers 340a from a first gas supply unit 300a of a gas supply unit 300. The processing gas is the processing gas that is used in the step ST2 and the step ST3 of the method MT. As is the case with the gas supply unit 30 of the plasma processing apparatus 10, the first gas supply unit 300a includes a plurality of gas sources, a plurality of valves, and a plurality of flow rate controllers.

A first electrode 342 is embedded in the ceiling member 340 on an upper side of the gas chambers 340a. In addition, a second electrode 344 is embedded in the ceiling member 340 on a lower side of the gas chambers 340a. A second high-frequency power supply HFS is connected to the first electrode 342 and the second electrode 344 through a second matching unit MU2 so as to form a high-frequency electric field between the electrodes, that is, at the inside of the gas chambers 340a. In addition, a heater HT is embedded in the ceiling member 340 on an upper side of the first electrode 342. The heater HT is connected to a heater power supply HP. In addition, another gas chamber 340b is formed in the ceiling member 340 on a lower side of the second electrode 344. A gas to be mixed with the processing gas in the space S is supplied to the gas chamber 340b from a second gas supply unit 300b of the gas supply unit 300.

An ion trap 400 is provided immediately below the ceiling member 340. The ion trap 400 is formed by a conductive material such as a metal, and has an approximately disc shape. The ion trap 400 is electrically connected to the processing container 120 so as to have the same potential as that of the processing container 120. For example, a distance GP between a lower surface of the ion trap 400 and an upper surface of the electrostatic chuck 22 is 30 mm or greater. A plurality of holes 400h, which extend from the gas chambers 340a, are formed in the ceiling member 340 and the ion trap 400. In addition, holes 400i, which extend from the gas chambers 340b, are formed in the ceiling member 340 and the ion trap 400.

In a case of using the plasma processing apparatus 100 in execution of the method MT, in the step ST2, the processing gas is supplied to the gas chambers 340a and the high-frequency wave HF from the second high-frequency power supply HFS is supplied to the first electrode 342 and the second electrode 344. In addition, in the step ST2, the high-frequency bias LF from the first high-frequency power supply LFS is not supplied to the lower electrode 20. The processing gas is excited in the gas chambers 340a due to execution of the step ST2. In addition, radicals generated in the gas chambers 340a are supplied into the space S after passing through the holes 400h and are adsorbed to the layer to be etched EL of the wafer W.

In addition, the processing gas is continuously supplied into the gas chambers 340a, also in the step ST3. In the step ST3, supply of the high-frequency wave HF from the second high-frequency power supply HFS is stopped. In addition, in the step ST3, the high-frequency bias LF from the first high-frequency power supply LFS is supplied to the lower electrode 20. Due to execution of the step ST3, the processing gas is supplied into the space S, and ions of rare gas atoms are generated by the high-frequency bias LF. The ions are drawn into the wafer W, and thus atoms, to which the radicals are adsorbed, of the layer to be etched EL are released and exhausted from the layer to be etched EL. When repeating the sequence SQ including the step ST2 and the step ST3, it is possible to etch the layer to be etched EL even using the plasma processing apparatus 100.

Hereinbefore, various embodiments are described. However, various modifications may be made without being limited to the above-described embodiments. For example, the plasma source for excitation of the processing gas may be an arbitrary plasma source, and the processing gas may be excited, for example, by microwaves. In addition, in execution of the method MT, it is also possible to use an arbitrary plasma processing apparatus that uses remote plasma.

REFERENCE SIGNS LIST

10: Plasma processing apparatus
12: Processing container
14: Mounting stage
20: Lower electrode
22: Electrostatic chuck
24: Power supply
LFS: First high-frequency power supply
HFS: Second high-frequency power supply
MU1: First matching unit
MU2: Second matching unit
28: Exhaust device
30: Gas supply unit 34: Window member
36: Coil
40: Ion trap
42: Control unit
100: Plasma processing apparatus
120: Processing container
300: Gas supply unit
340: Ceiling member
340a: Gas chamber
342: First electrode
344: Second electrode
400: Ion trap
W: Wafer
EL: Layer to be etched

The invention claimed is:

1. A method for etching a layer to be etched of a workpiece, the method comprising:
   mounting the workpiece on a mounting stage in a processing container of a plasma processing apparatus, wherein the processing container provides an internal space including a first space and a second space, the mounting stage includes a lower electrode and is provided in the first space, and an ion trap is provided between the first space and the second space to substantially trap all ions from a plasma generated in the second space;
   adsorbing radicals to the layer without applying a frequency bias to the lower electrode, wherein the radicals are generated from a processing gas including a rare gas in the second space and supplied from the second space to the first space through the ion trap; and
   drawing ions into the layer by applying the frequency bias to the lower electrode, wherein said drawing ions is performed in a state where the processing gas is supplied to the second space in succession to said adsorbing radicals, the rare gas included in the processing gas is supplied from the second space to the first space through the ion trap, and the ions are generated from the rare gas in the first space by the frequency bias applied to the lower electrode,
   wherein said adsorbing radicals and said drawing ions are alternately repeated, and
   in said drawing ions, the frequency bias having a power density of 0.07 $W/cm^2$ or less at a surface of the lower electrode is supplied to the lower electrode or the frequency bias having a power density of 0.14 $W/cm^2$ or less at the surface of the lower electrode is supplied to the lower electrode for a period of 0.5 seconds or less.

2. The method according to claim 1,
   wherein in said drawing ions, the frequency bias having a power density of 0.07 $W/cm^2$ or less at the surface of the lower electrode is supplied to the lower electrode for a period of 2 seconds or less.

3. The method according to claim 1,
   wherein during an execution period of said drawing ions, impedance of a matching unit is fixed, the matching unit being provided between a power supply configured to generate the frequency bias and the lower electrode.

4. The method according to claim 3,
   wherein during the execution period of said of drawing ions, a variable parameter of a variable electric element of the matching unit is fixed.

* * * * *